United States Patent
Brandt

Patent Number: 5,859,550
Date of Patent: Jan. 12, 1999

[54] NETWORK SWITCHING SYSTEM INCLUDING A ZERO-DELAY OUTPUT BUFFER

[75] Inventor: William P. Brandt, Groton, Mass.

[73] Assignee: Cisco Technology, Inc., San Jose, Calif.

[21] Appl. No.: 877,135

[22] Filed: Jun. 16, 1997

Related U.S. Application Data

[63] Continuation of Ser. No. 575,128, Dec. 19, 1995, abandoned.

[51] Int. Cl.$^6$ ............................................. H03L 7/00
[52] U.S. Cl. ..................... 327/156; 327/159; 327/147; 327/150
[58] Field of Search ..................... 327/141, 144, 327/146, 150, 155, 159, 233, 236, 243, 244, 291, 292, 299

[56] References Cited

U.S. PATENT DOCUMENTS

| | | | |
|---|---|---|---|
| 4,680,779 | 7/1987 | Wakerly | 375/107 |
| 4,847,516 | 7/1989 | Fujita et al. | 327/293 |
| 5,049,766 | 9/1991 | van Driest et al. | 327/273 |
| 5,087,829 | 2/1992 | Ishibashi et al. | 327/244 |
| 5,122,679 | 6/1992 | Ishii et al. | 327/295 |
| 5,294,842 | 3/1994 | Iknaian et al. | 327/141 |
| 5,307,381 | 4/1994 | Ahuja | 327/156 |
| 5,361,277 | 11/1994 | Grover | 327/141 |
| 5,420,544 | 5/1995 | Ishibashi | 327/156 |
| 5,486,783 | 1/1996 | Baumert et al. | 327/158 |
| 5,517,147 | 5/1996 | Burroughs et al. | 327/295 |
| 5,539,344 | 7/1996 | Hatakenaka | 327/156 |
| 5,544,203 | 8/1996 | Casasanta et al. | 327/150 |
| 5,548,249 | 8/1996 | Sumita et al. | 327/159 |

*Primary Examiner*—Tuan T. Lam
*Attorney, Agent, or Firm*—Cesari and McKenna LLP

[57] ABSTRACT

A zero-delay buffer circuit includes a modified phase-locked loop (PLL) circuit configured to minimize clock skew among data output buffers of modules within a high-speed network switch system. Each module includes an application-specific integrated circuit (ASIC) chip that contains the modified PLL circuit; circuitry inserted within a feedback loop of the PLL is representative of a clock distribution tree that is common to the output buffers of the chip. The absolute delay of that tree typically differs among the ASICs because of process, voltage and temperature variations within the system. The circuitry inserted within the feedback loop effectively compensates for the absolute delay of the common distribution tree circuit components.

12 Claims, 5 Drawing Sheets

NETWORK SWITCHING SYSTEM INCLUDING A ZERO-DELAY OUTPUT BUFFER

CROSS REFERENCE TO RELATED APPLICATIONS

This application is a continuation of application Ser. No. 08/575,128 filed Dec. 19, 1995, now abandoned.

FIELD OF THE INVENTION

This invention relates generally to the distribution of clock signals in a network switch system and, more specifically, to the distribution of high-speed clock signals to output buffers of a module within a network switch system with as little skew as possible.

BACKGROUND OF THE INVENTION

In a network switch system having a plurality of modules coupled to a bi-directional bus, one of the signals transmitted to bus interface circuits on each module is a clock signal used to control the timing of data transfer operations. This clock signal synchronizes the transmission and reception of data between physically separated points on the bus.

For proper operation of the system, clock signals should arrive at the bus interface circuitry at the same time; otherwise, reliable data transmission is not ensured. For example, if a bus interface circuit receiving data is "clocked" later than others, the earlier-clocked bus interface circuits may overwhelm the data before it is stored at its proper destination. This lack of simultaneity in reception of the clock signals, i.e., clock skew, directly increases the amount of time that the data must remain stable on the bus to ensure reliable data transmission; this, in turn, increases the time required for each data transfer on the bus and, thus reduces the speed of the bus.

The amount of clock skew introduced into a network switch system is a direct function of the variations and propagation delays among clock transmitter and receiver chips, and velocity factor differences in module etch of the system. A chip, i.e., a small, single piece of silicon on which integrated circuits are formed, typically comprises transistors. In digital logic applications, a transistor switches "on" when saturated and "off" when non-conducting to generate full "signal" swings between two power supply voltages. Propagation delay is affected by the switching speed of the transistor and is highly dependent upon variations in the fabrication process of the chip. In addition, the applied voltage, the operating temperature and the loading conditions of the chip effect its switching speed.

For logic switching applications, the transistors of a chip are typically configured as inverter and buffer circuits. An inverter inverts the logic sense of a binary signal; a buffer is used merely for signal amplification. That is, the buffer circuit does not produce any particular logic function since the binary value of the output is the same as the binary value of the input. However, buffering of low-level signals within semi-conductor chips to develop high-level digital pulse signals is very susceptible to propagation delay variations due to process, voltage, and temperature (PVT) variations. Differences in propagation delay between clock buffer chips in a system directly translate into skew. The magnitude of such skew is exacerbated when the clocking speed of the system (and, in particular, the switching speed of the transistors) increases.

The problem of clock skew in a high-speed clocking system is addressed partly by employing a central system clock source that generates and distributes clock signals to the respective modules over unidirectional clock lines. For example, clock generation circuits of the source preferably distribute the generated clock signals over identical trace lengths such that these signals arrive essentially simultaneously at the modules. In each module, the incoming clock signals are typically processed, e.g., shaped and amplified, before use by various components of the module. Such processing necessarily delays the signals; the delays can be expected to vary from module to module of the system because of PVT variations among the modules.

In addition, the topology of the clock distribution path located on each module can be expected to vary from module to module. These variations contribute significantly to clock skew and the present invention is directed to the reduction of that skew. More specifically, the present invention is directed to delivering low-skew, high-speed clock signals to points on the module where the clock signals are actually used, i.e., at their output buffers.

SUMMARY OF THE INVENTION

The invention comprises a zero delay buffer circuit having a modified phase-locked loop (PLL) circuit configured to minimize clock skew among data output buffers of modules within a high-speed network switch system. Each module includes an application-specific integrated circuit (ASIC) chip that contains the modified PLL circuit; circuitry inserted within a feedback loop of the PLL is representative of a clock distribution tree that is common to the output buffers of the chip. The absolute delay of that tree typically differs among the ASICs because of process, voltage and temperature (PVT) variations within the system. According to the invention, the circuitry inserted within the feedback loop effectively compensates for the absolute delay of the common distribution tree circuit components.

In the illustrative embodiment, the ASIC chip receives input clock signals of a predetermined frequency that are transmitted to each module of the network switch system from a central clock generator over unidirectional clock lines. These clock signals are further distributed to data output buffer paths of the ASIC via common clock distribution tree circuitry. The modified, PVT-compensating PLL circuit, in addition to compensating for the absolute delay associated with this common circuitry, increases the predetermined frequency of the input clock signals so that high-speed versions of these signals are received by the data output buffers.

Advantageously, each ASIC appears, from a system perspective, to provide a substantially fast distribution response time from its clock input to each of its data output buffers, i.e., a zero delay clock distribution response time, despite PVT variations. According to the principles of the invention, this zero-delay response time operates to minimize clock skew, and thus increase the data transmission rate, among the various modules of the network switch system.

BRIEF DESCRIPTION OF THE DRAWINGS

For a fuller understanding of the nature and objects of the invention, reference should be had to the following detailed description taken in connection with the accompanying drawings, in which.

DETAILED DESCRIPTION OF THE PREFERRED EMBODIMENTS

Figure 1:
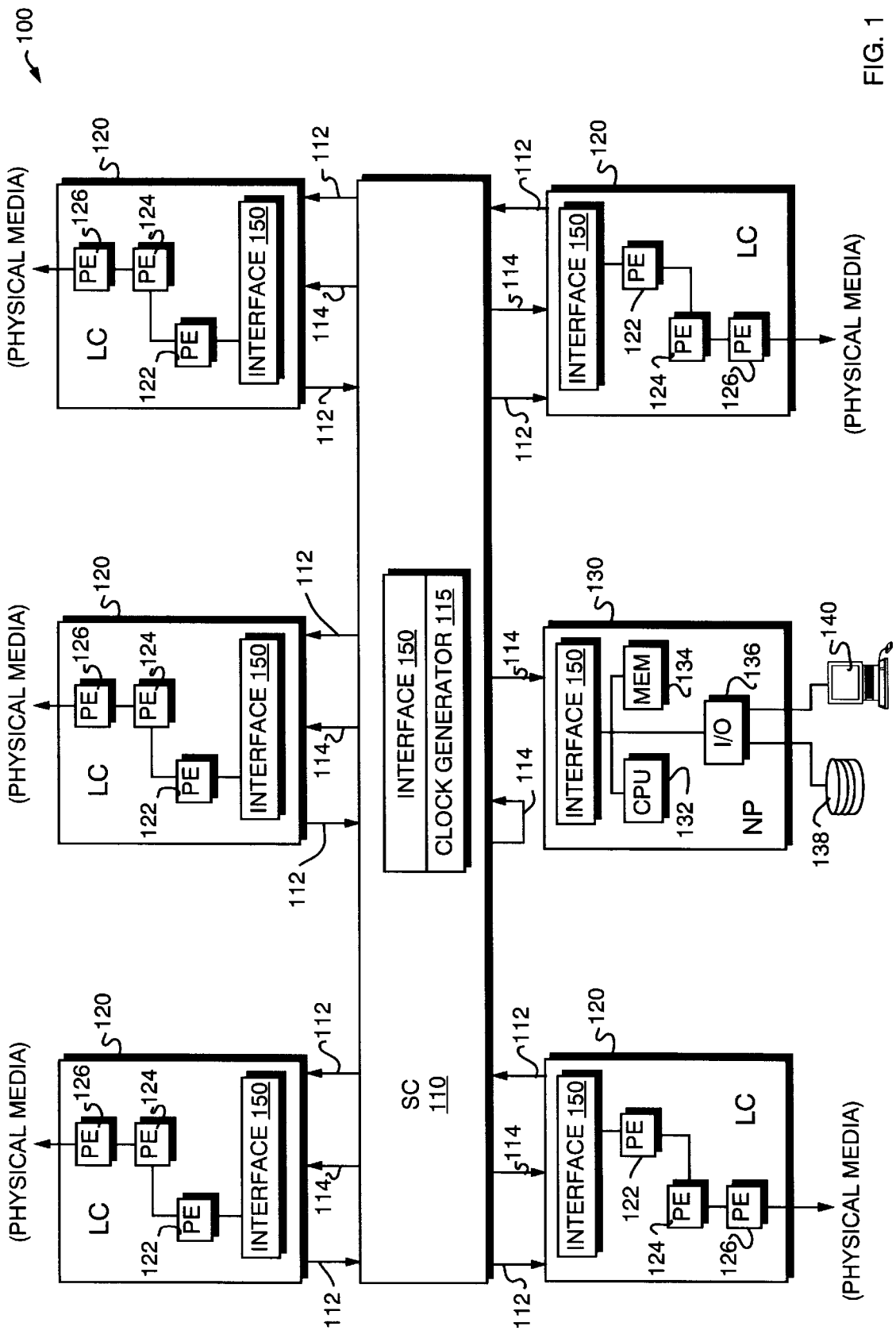
FIG. 1 is a schematic block diagram of a synchronous, high-speed network switch system including a plurality of modules having clock interface circuits in which the present invention may advantageously operate.

Referring to FIG. 1, a synchronous network switch system 100 typically includes a network processor (NP) module 130 and a plurality of line card (LC) modules 120 interconnected by a high-speed switch card (SC) module 110. The NP module 130 generally comprises a central processor unit (CPU) 132 connected to a main memory (MEM) 134 and an input/output unit (I/O) 136, the latter unit being further coupled to peripheral I/O devices such as a disk drive 138 and a display monitor 140. The NP module 130 typically performs complex system-level tasks such as discovering the network topology and establishing network connections, along with handling real-time, protocol-specific management tasks.

The LC modules 120, on the other hand, function as edge or trunk-type connectors for attaching to physical communication media (PHYSICAL MEDIA), such as Ethernet, Fiber Distributed Data Interface (FDDI) and High Level Data-Link Control/ Synchronous Data-Link Control (HDLC/SDLC) format media. Various data processing communication functions, such as packet-type detection, data conversion and routing decisions, are performed on these modules in connection with an arrangement of processing elements (PE) 122–126.

The SC module 110 is preferably implemented as a mid-plane, cross-bar switch that interconnects the LC and NP modules via unidirectional, equal-length, point-to-point data and clock line traces 112, 114. A clock generator circuit 115 of the SC module generates clock signals having a predetermined frequency for synchronizing the operations of the network switch system. These system clock signals are globally-distributed to each module via the unidirectional clock lines 114; notably, the SC module also has a separate, equal-length clock line 114 "looping back" to itself so that it may receive a clock signal over that line.

Moreover, each module includes a clock interface chip (INTERFACE) circuit 150 for receiving the distributed system clock signals as input clock signals. The interface chip is preferably an application-specific integrated circuit (ASIC) functionally configured to process, i.e., shape and amplify, the input clock signals prior to generating multiple copies of them. The resulting processed clock signals are thereafter distributed to input and output buffer circuitry on the ASIC interface chip 150.

Figure 2:
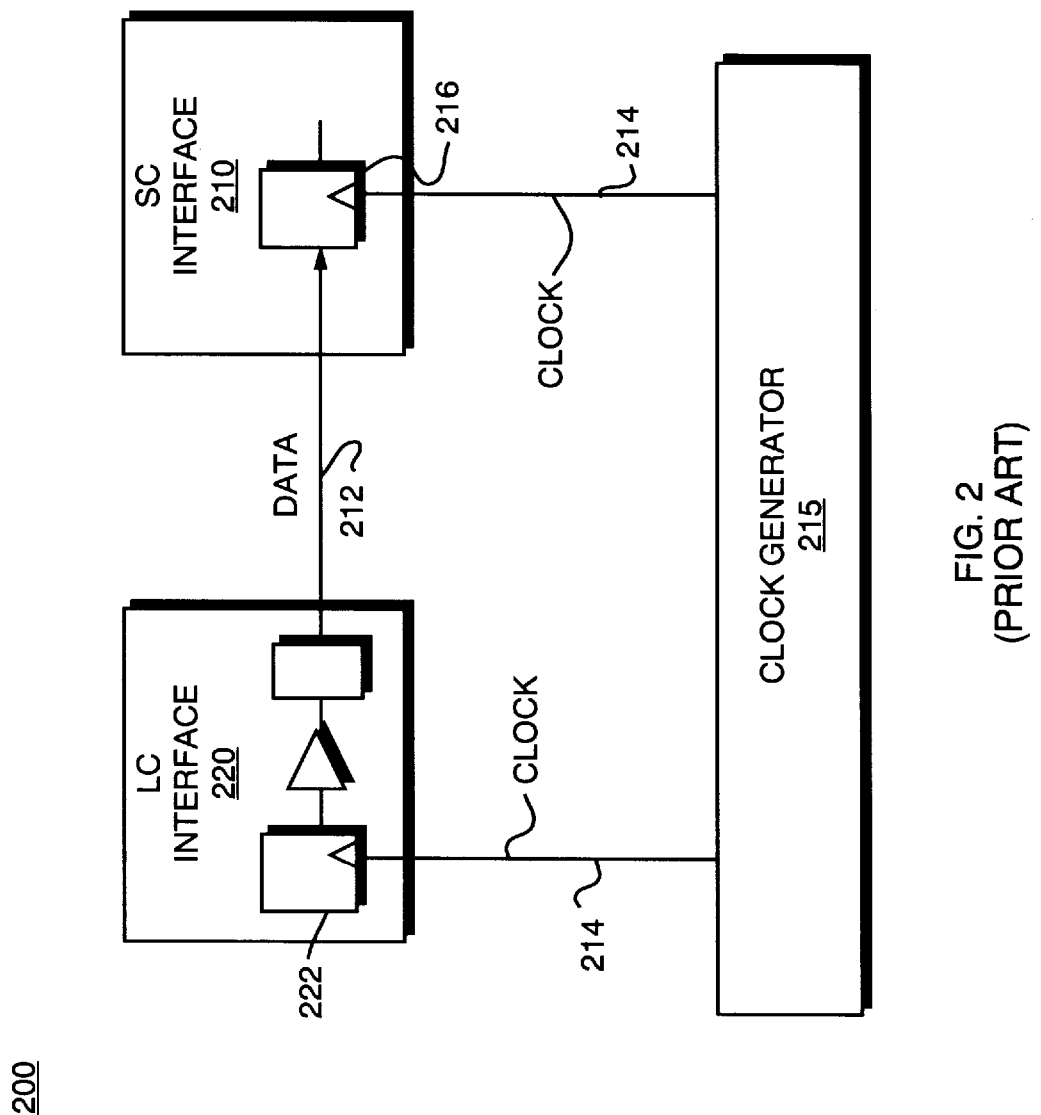
FIG. 2 is a highly schematized block diagram illustrating distribution of clock signals from a clock generator circuit to data transmitting and receiving clock interface circuits.

FIG. 2 is a highly schematized block diagram illustrating an architecture 200 for distributing clock signals to transmitting and receiving data buffer circuits of the ASIC interface chips over clock line traces 214. The transmitting data buffer circuit on, e.g., the LC interface chip 220, includes a register 222 that "clocks" data out at the predetermined clock frequency, while the receiving data buffer circuit on, e.g., the SC interface chip 210, includes a register 216 that captures the data at this frequency. Accordingly, both registers are timed from the same clock signals generated and distributed by the clock generator 215.

In a prior art embodiment of FIG. 2, the frequency of the distributed clock signals is 25 Mhz, which translates to a 40 nanosecond (nsec) clock cycle period. Twenty percent of this period (or 8 nsec) is typically consumed by clock skew. However, the clock signals of the illustrative embodiment of the present invention are received by the data buffer registers using this same distribution architecture, but at an increased frequency of, for example, 100 Mhz. That is, although the clock signals are distributed to the ASIC interface chips at a rate of 25 Mhz, those signals are subsequently delivered to the data buffer circuits at a clocking speed of 100 Mhz or, in other words, at a period of 10 nsecs. Clearly, 8 nsecs of skew is unacceptable for such a high-speed system and the present invention is generally directed to reducing that skew.

Referring also to FIG. 1, techniques used in the illustrative embodiment to partially reduce the system clock skew involve implementing the clock generator circuit 115 on a single, silicon chip and distributing the clock signals generated by this circuit over equal-length line traces 114 incorporated on the same layer of the SC module 110 via identical clock distribution paths. In addition to minimizing propagation delays, these techniques contribute to reducing skew attributable to process, voltage, and temperature (PVT) variations among the distributed clock signals. Yet, despite such "equalization", approximately 1½ nsecs of clock skew remain at the data buffer circuits located at the end of the distribution paths.

Although the invention is directed to reducing delay as much as possible, attempts to operate data buffer registers at "zero" delay times have generally caused set-up and hold problems. For example, if a register 222 is configured to provide data at its output at time t and another register 216 is further configured to receive that data at time t, the presence of any skew in the system may result in the latter circuit sampling portions of either previous (stale) data or the intended data; significantly, the nature of data actually captured at register 216 is indeterminate. In order to rectify this situation, the receiving data buffer circuits of the inventive ASIC interface chips are preferably implemented with the highest-speed, lowest set-up and hold time circuits commercially available. The present invention therefore is directed to delivering low-skew, high-speed clock signals to transmitting, data output buffer circuits on the ASIC interface chips.

Figure 3:
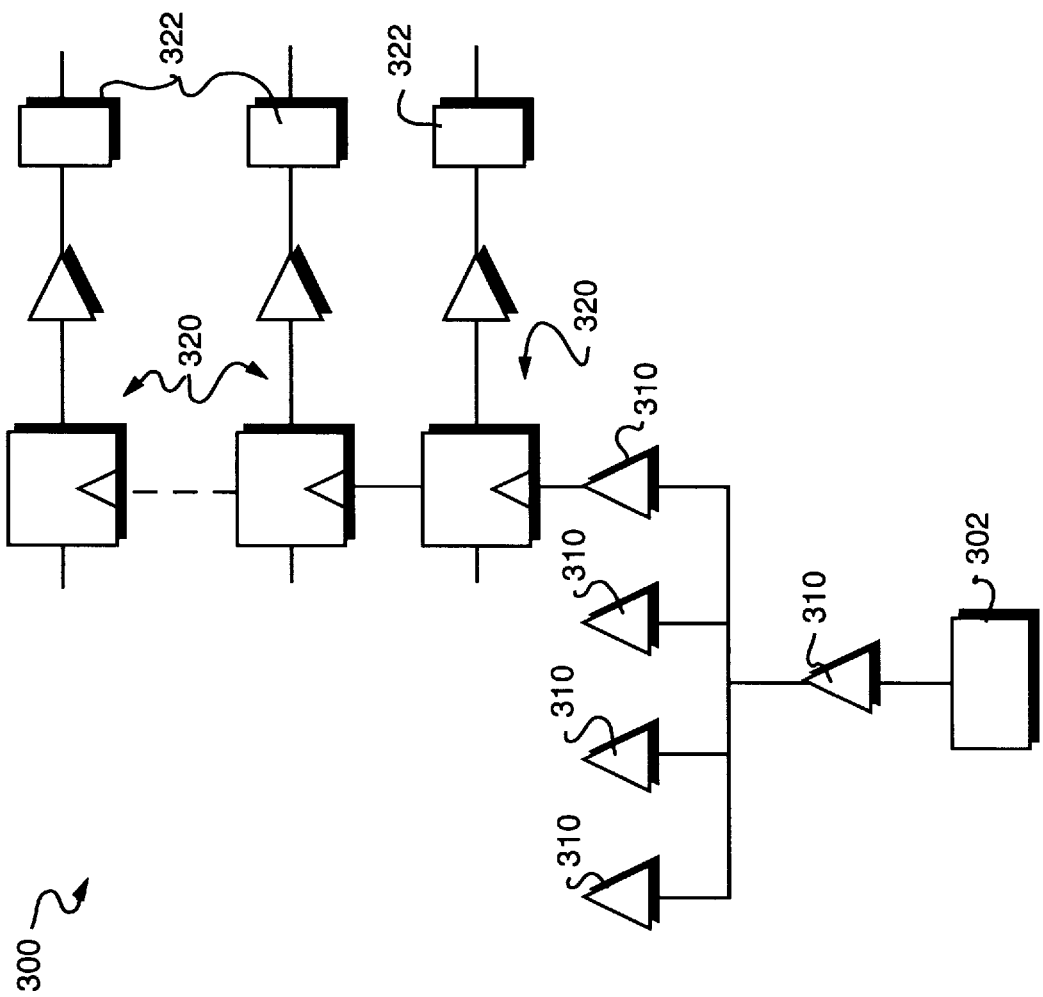
FIG. 3 is a schematic diagram of a clock distribution tree contained on a transmitting clock interface circuit.

FIG. 3 is a schematic diagram of a clock distribution tree 300 contained on a transmitting ASIC interface chip. Globally-distributed clock signals are received at an input 302 of the ASIC chip and these signals are provided to numerous clock distribution buffers 310 for further processing and distribution to various data output buffer circuits 320 on the chip. Significantly, the clock signals are distributed to equally-balanced loads over equal-length traces of the internal tree 300. In the present embodiment, the clock signals typically drive loads of approximately 2000 flip-flops, thus requiring fan-out of driver circuits.

As noted, there are preferably identical trace lengths between output buffers 320 such that the clock distribution tree 300 within each ASIC chip is symmetrical. Although such symmetry is intended to reduce skew, it also typically introduces substantial propagation delay. That is, between any of the data output endpoints 322 on the chip, there is low skew, yet large delay relative to the clock input 302; moreover, these forms of non-simultaneity change rather dramatically with PVT variations among ASIC chips of the system.

Hence, the invention is particularly directed to a timing parameter pertaining to clock-input of the ASIC to data-output of that chip. In general, there are two principle components to this parameter: the absolute maximum time and the minimum time. The difference between these components indicates the skew between a "best" case and "worst" case silicon process. In the illustrative embodiment, there is approximately 1½ nsecs of minimum skew and approximately 6 nsecs of absolute maximum delay. The absolute delay component (i.e., propagation delay) is more difficult to control because of PVT variations associated with various clock distribution trees among the modules of the system.

In accordance with the invention, a zero delay buffer circuit is provided having a modified, PVT-compensating phase-locked loop (PLL) circuit configured to minimize clock skew among data output buffers of transmitting modules within a high-speed network switch system. The ASIC chip on each module preferably contains the modified PLL circuit including circuitry inserted within its feedback loop that is representative of a clock distribution tree common to the output buffers of the chip. This inserted circuitry effectively compensates for the absolute delay of the clock distribution tree circuit components.

Figure 4:
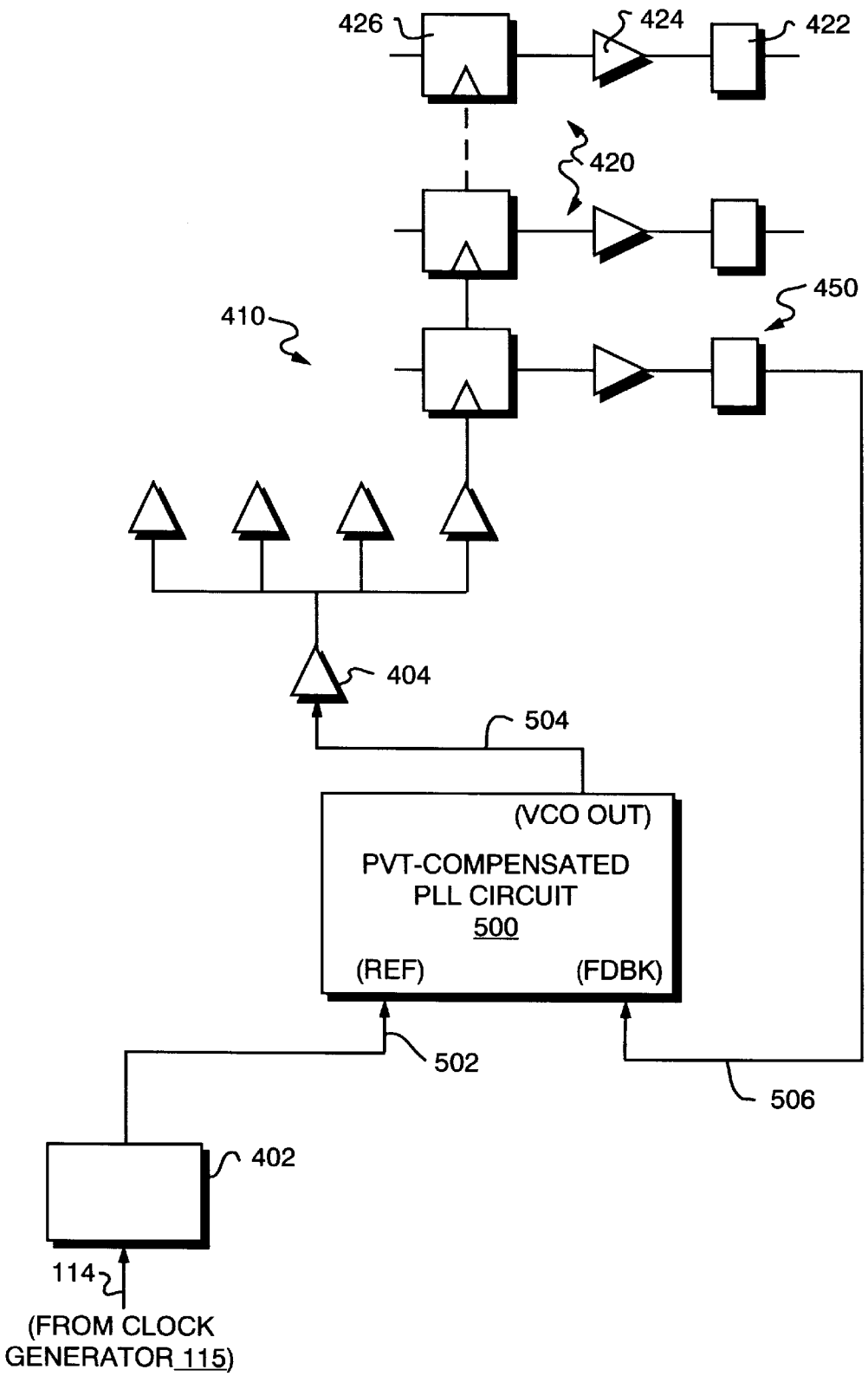
FIG. 4 is a schematic block diagram showing the relative placement of a PVT-compensating PLL circuit within the clock distribution tree of FIG. 3.

FIG. 4 is a schematic block diagram showing the relative placement of the PVT-compensating PLL circuit 500 of the invention within a clock distribution tree 400 of an ASIC interface chip. The ASIC chip receives clock signals of a predetermined frequency at an input terminal 402; these clock signals are transmitted to each module of the network switch system from the clock generator 115 (FIG. 1) over unidirectional clock lines 114. The novel circuit 500 is preferably coupled to the output of input terminal 402 by way of line 502 carrying reference (REF) clock signals and to the input of clock distribution buffer 404 via line 504 used to provide VCO output (VCO OUT) clock signals. The clock signals are further distributed to output data buffer paths 420 of the AISC via common clock distribution tree circuitry 410 that includes buffer 404. In the illustrative embodiment, there are 80 data output paths on each ASIC chip. As can be seen, the common circuitry 410 preferably comprises an arrangement of various clock distribution buffer paths.

Each data output buffer path 420 has identical clock distribution circuit components clocked from the same clock signal. For example, each path 420 includes a register 426, an output buffer 424 and an output terminal 422. Since these paths are on the same ASIC chip, routing of clock signals may be controlled to an extent that timing differences between any two output paths are insubstantial. However, placement of these paths on the same chip does not compensate for the absolute delay/skew associated with the clock-input to data-output timing parameter. Accordingly, an additional data output path 450 is provided as common clock distribution tree circuitry inserted into the feedback loop of the novel PLL circuit 500. The arrangement of components included in path 450 is identical to that of the data output paths 420 coupled to the distribution tree path 410. Paths 410 and 450 connect to the PLL circuit 500 by way of a line 506 used to transport feedback (FDBK) clock signals.

Figure 5:
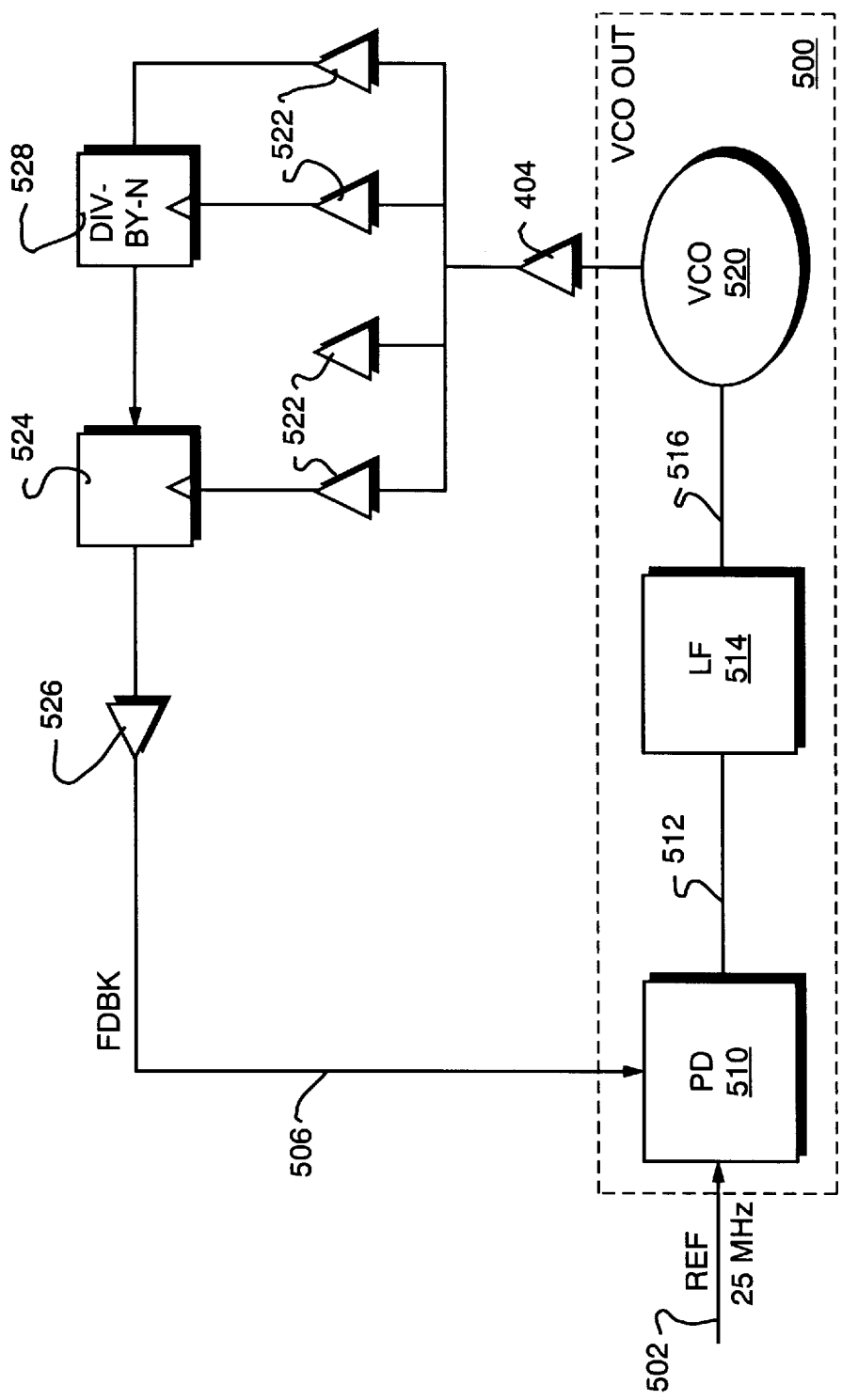
FIG. 5 is a schematic block diagram of the PVT-compensating PLL circuit in accordance with the invention.

FIG. 5 is a schematic block diagram of the PVT-compensating PLL circuit 500. In addition to compensating for the absolute delay associated with the common clock distribution tree circuitry, the inventive circuit 500 increases the predetermined frequency of the clock signals received at the ASIC chip so that high-speed versions of these signals may be delivered to the data output buffer circuits; that is, the circuit 500 also performs frequency multiplication with respect to the input clock signals.

Specifically, 25 Mhz REF clock signals are received by a phase detector (PD) circuit 510 over line 502. The PD circuit 510 provides an output voltage signal over line 512 to a loop filter (LF) circuit 514; this output voltage signal is proportional to the phase difference between the REF clock signals and the FDBK clock signals on line 506. The LF circuit 514 is generally a low-pass filter that smoothes out high-frequency transmissions from the PD 510 to provide a very low-frequency control voltage signal to VCO circuit 520 over line 516. VCO 520, in turn, produces VCO OUT clock signals over line 504 having an increased frequency that is proportional to the input control voltage, e.g., 100 Mhz clock signals.

The 100 Mhz clock signals are preferably used to time registers 426 (FIG. 4) included within the data output buffer paths 420 over common clock distribution path circuitry 410. According to the invention, components of those paths are replicated within the feedback loop, i.e., the loop between the VCO 520 and PD 510 of the circuit 500, to compensate for the propagations delays associated with the paths. Those components include clock distribution buffers 522, register 524 and output buffer 526. Specifically, the 100 Mhz clock signals are used to "clock" register 524. These clock signals are also divided in frequency to 25 Mhz by divide-by-N circuit 528; the 25 Mhz clock signals are fed to the data input of register 524 and provided to PD circuit 510 over line 506 as FDBK clock signals, where they are substantially aligned in phase and frequency with the REF clock signals.

In accordance with the invention, the propagation delays encountered by the clock signals traversing the components 522–526 of the feedback loop compensate for those delays provided by the internal clock distribution paths 410 and 420 of the ASIC chip. In particular, the PVT-compensating PLL circuit functions to compensate for changes in process, voltage and temperature variations so that the net effect is extremely tight timing control of the clock-input to data-output timing parameter; this allows the system to accommodate data transfer operations at 100 Mb/s.

More specifically, each ASIC appears, from a system perspective, to provide a substantially fast distribution response from its clock input to each of its data output buffers, i.e., a zero delay clock distribution response time, despite PVT variations. According to the principles of the invention, this zero-delay response time operates to minimize clock skew, and thus increase the data transmission rate, among the various modules of the network switch system.

While there has been shown and described an illustrative embodiment for implementing a zero-delay buffer circuit having a PVT-compensating PLL circuit configured to minimize clock skew among data output buffers of modules within a high-speed network switch system, it is to be understood that various other adaptations and modifications may be made within the spirit and scope of the invention. For example, the PVT-compensating PLL circuit described herein includes circuitry inserted within its feedback loop representative of a clock distribution tree that is common to data output buffers of an ASIC chip. However, according to the principles of the invention, any common circuitry in the ASIC chip can be replicated in the feedback loop of the novel PLL circuit to provide a zero-delay circuit among the other modules of the system independent of the PVT characteristics of any particular ASIC chip. Also, although not shown in FIG. 5, it should be understood that the output terminal of path 450 is present between the output of component 526 and the input of PD 510.

The foregoing description has been directed to specific embodiments of this invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A network switching system including a clock generator which generates an input clock signal of predetermined frequency, the system comprising:

a network processor module responsive to the input clock signal; and a plurality of line card modules each attached to a physical communication media and responsive to the input clock signal, wherein said network processor module and said plurality of line card modules each includes an interface circuit which includes a zero-delay output buffer comprising a modified phase-locked loop (PLL) circuit configured to receive the input clock signal and to deliver output clock signals having a higher frequency than said predetermined frequency to a plurality of data output buffer paths via a clock distribution tree having an associated absolute propagation delay, said modified PLL circuit containing circuitry inserted within a feedback loop thereof, the circuitry including a divider circuit clocked by one of said output clock signals for generating from said one of said output clock signals another signal of said predetermined frequency for being input to a register clocked by another one of said output clock signals, the circuitry also replicating components of each of the plurality of data output buffer paths and being configured to essentially entirely compensate for said associated absolute propagation delay, and whereby the zero-delay output buffer reduces clock skew among the data output buffer paths of the plurality of modules of the system, said divider circuit not being a replicated component of the data output buffer paths.

2. The network switching system of claim 1 wherein the interface circuit comprises an application-specific integrated circuit (ASIC) chip containing the modified PLL circuit.

3. The network switching system of claim 2 wherein the clock distribution trees of different interface circuits of said system have different respective absolute propagation delays as a result of process, voltage and temperature (PVT) variations within the system.

4. The network switching system of claim 1 wherein the input clock signal is transmitted to each module of the system from a centrally-located clock generator via a unidirectional clock line.

5. The network switching system of claim 1 wherein said register generates a feedback signal for use by a phase detector of said modified PLL circuit.

6. The network switching system of claim 5 wherein said phase detector generates an error signal which is indicative of phase difference between the feedback signal and the input clock signal of the predetermined frequency, said error signal being supplied via a filter to a controllable oscillator for generating said output clock signals, said error signal being for controlling generation of said output clock signals by said controllable oscillator.

7. A network switching system, comprising:

a switch card including a clock generator which generates an input clock signal of predetermined frequency;

a network processor module responsive to said input clock signal; and a plurality of line card modules each attached to a physical communication media and responsive to said input clock signal, wherein said network processor module and said plurality of line card modules each includes an interface circuit which includes a zero-delay output buffer comprising a modified phase-locked loop (PLL) circuit configured to receive the input clock signal and to deliver output clock signals having a higher frequency than said predetermined frequency to a plurality of data output buffer paths via a clock distribution tree having an associated absolute propagation delay, said modified PLL circuit containing circuitry inserted within a feedback loop thereof, the circuitry including a divider circuit clocked by one of said output clock signals for generating from said one of said output clock signals another signal of said predetermined frequency for being input to a register clocked by another one of said output clock signals, the circuitry also replicating components of each of the plurality of data output buffer paths and being configured to essentially entirely compensate for said associated absolute delay, and whereby the zero-delay output buffer reduces clock skew among the data output buffer paths of the plurality of modules of the system, said divider circuit not being a replicated component of the data output buffer paths.

8. The network switching system of claim 7 wherein the interface circuit comprises an application-specific integrated circuit (ASIC) chip containing the modified PLL circuit.

9. The network switching system of claim 8 wherein the clock distribution trees of different interface circuits of said system have respective absolute propagation delays that differ as a result of process, voltage and temperature (PVT) variations within the system.

10. The network switching system of claim 7 wherein the input clock signal is transmitted to each module of the system from a centrally-located clock generator via a unidirectional clock line.

11. The network switching system of claim 7 wherein said register generates a feedback signal for use by a phase detector of said modified PLL circuit.

12. The network switching system of claim 11 wherein said phase detector generates an error signal which is indicative of phase difference between said feedback signal and the input clock signal of the predetermined frequency, said error signal being supplied via a filter to a controllable oscillator for generating said output clock signals, said error signal being for controlling generation of said output clock signals by said controllable oscillator.

* * * * *